United States Patent [19]

Festa

[11] 4,110,775
[45] Aug. 29, 1978

[54] SCHOTTKY DIODE WITH VOLTAGE LIMITING GUARD BAND

[76] Inventor: Thomas A. Festa, 5250 Round Meadow Rd., Hidden Hills, Calif. 91302

[21] Appl. No.: 854,848

[22] Filed: Nov. 25, 1977

Related U.S. Application Data

[63] Continuation of Ser. No. 716,427, Aug. 23, 1976, abandoned.

[51] Int. Cl.² ............................................. H01L 29/48
[52] U.S. Cl. ......................................... 357/15; 357/13; 357/40; 307/317 A; 307/318; 307/237; 361/56; 361/91
[58] Field of Search ............................ 357/15, 13, 40; 307/317 A, 318, 303, DIG. 6, 237; 361/56, 91

[56] References Cited
U.S. PATENT DOCUMENTS 4,025,802   5/1977   Inoue et al. ........................... 307/318

OTHER PUBLICATIONS

M. Lepselter et al., "Silicon Schottky Barrier Diode with Near-Ideal I-V Characteristics," B.S.T.J., Feb. 1968, pp. 195-208.
H. Kalter, "Semiconductor Chip Pad Protect Device," IBM Tech. Discl. Bull., vol. 15, #12, May 1973, pp. 3753, 3754.

*Primary Examiner*—Joseph E. Clawson, Jr.
*Attorney, Agent, or Firm*—Blakely, Sokoloff, Taylor & Zafman

[57] ABSTRACT

A metal-semiconductor diode which includes an integral voltage clamping guard band. The guard band is defined by a p-type region disposed in an n-type epitaxial layer which layer contacts the anode barrier metal. The guard band in addition to reducing edge leakage, limits the reverse voltage on the metal-semiconductor barrier to less than its avalanche breakdown voltage. This provides transient voltage protection for the diode.

3 Claims, 5 Drawing Figures

$BV_S \geq BV_{PN}$

SCHOTTKY DIODE WITH VOLTAGE LIMITING GUARD BAND

This is a continuation of application Ser. No. 716,427, filed 8/23/76, now abandoned.

BACKGROUND OF THE INVENTION

1. Field of the Invention

The invention relates to circuit protection devices for diodes, in particular, guard bands for Schottky diodes.

2. Prior Art

Metal-semiconductor diodes, often referred to as Schottky diodes, generally include a metal layer deposited on a n-type monocrystalline silicon body which includes an epitaxial layer. A substantial difference in barrier heights between the forward biased and reversed biased metal-semiconductor interface exist. When sufficient forward biased is applied this barrier is essentially removed, thereby allowing electrons to freely flow from the semiconductor material into the metal.

Schottky diodes provide efficient rectification in power applications since their forward voltage drop is less than that of a PN junction diode. Moreover, these devices have fast recovery times making them particularly useful for high frequency rectification.

In practice, the majority of failures of Schotty diodes are due to transient voltages. These failures occur since surface defects in the semiconductor material or defects in the metal-semiconductor interface cause current crowding at the defects which damages the semiconductor material. As will be seen, the present invention provides an integral PN junction (diode) in the form of a guard band. This junction diode when reversed biased, conducts before an avalanche breakdown occurs in the Schottky diode.

Guard bands are employed in the prior art with Schottky diodes. Typically, a p-type guard band is disposed in the surface of an n-type epitaxial layer around the metal-semiconductor barrier. These guard rings are used to reduce the edge leakage current effects. In such prior art guard bands, the breakdown voltage of the junction diode is larger than that of the Schottky diode.

SUMMARY OF THE INVENTION

A Schottky diode fabricated on a silicon body which includes a silicon substrate and an epitaxial layer is described. A metal anode is deposited on the epitaxial layer to form the metal-semiconductor barrier of the Schottky diode. A guard band is diffused into the upper surface of the epitaxial layer about the metal anode prior to disposition of the metal anodes. The geometry and impurity concentration level of this p-type guard band is selected to assure that its breakdown voltage is lower than that of a Schottky diode. The guard band acts as a zener diode coupled in parallel with the Schottky diode. Transients are primarily conducted through the PN junction diode rather than the Schottky diode, thereby providing protection to the Schottky diode.

DETAILED DESCRIPTION OF THE INVENTION

A metal-semiconductor diode commonly referred to as a Schottky diode is described. The diode includes a guard band or ring which provides circuit protection for the Schottky diode from transient currents, and the like. In its presently preferred embodiment, the disclosed device is particularly useful in power applications, for currents in the range of 2 to 60 amps. The presently preferred embodiment is described in detail, including specific conductivity types, impurities, impurity concentration levels, and dimensions. However, it will be obvious to one skilled in the art that the inventive concepts disclosed in this application may be employed in other than the specifically disclosed embodiment.

Figure 2:
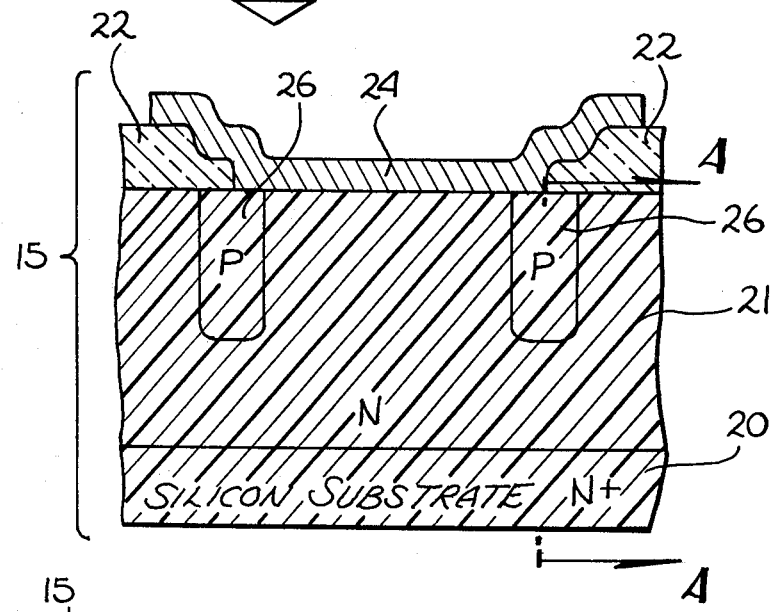
FIG. 2 is a cross-sectional elevation view of a Schottky diode with its protective guard band, fabricated in accordance with the present invention.
Figure 3:
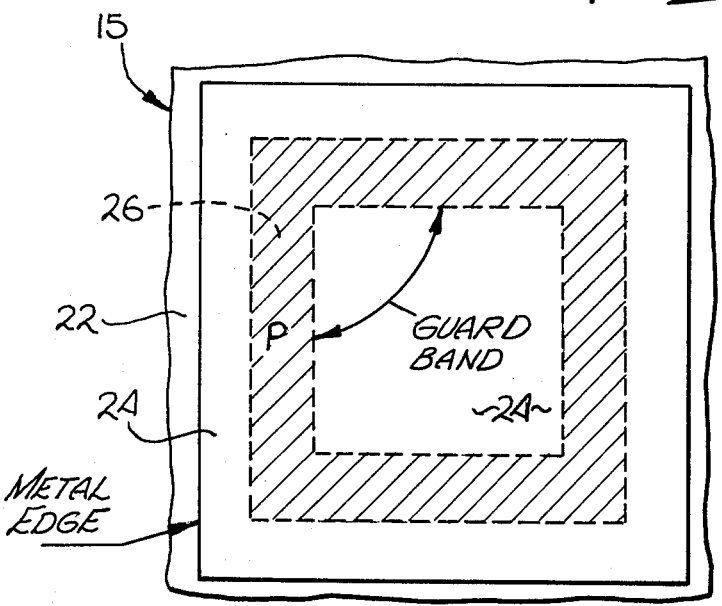
FIG. 3 is a plan view of the device of FIG. 2.

Referring first to FIGS. 2 and 3, the Schottky diode and its integral circuit protection means are most clearly illustrated. The device includes a silicon substrate 20 doped with an n-type dopant. An epitaxial n-type layer 21 is formed on one surface of the substrate 20. A generally rectangular guard band 26 which comprises a continuous p-type region is formed within the upper surface of the epitaxial layer 21. This p-type region may be fabricated employing known photolithographic techniques. A standard diffusion furnace is employed in the presently preferred embodiment to form the p-type region 26, however, ion implantation may be used.

The guard band region 26 defines a generally rectilinear area on the surface of the epitaxial layer 21. A silicon dioxide or silicon oxide band 22 is formed about the periphery of this area, in contact with region 26. A metal layer 24 is deposited on this area in intimate contact with the epitaxial layer 21. This metal layer contacts the region 26 and extends over the edge of the oxide band 22.

The interface between the metal layer 24 and the epitaxial layer 21 provides the metal-semiconductor barrier, that is, the Schottky diode. This diode operates in a well-known manner and when forward biased electrons readily flow from the epitaxial layer 21 to the metal layer 24. When reverse biased, an avalanche breakdown occurs at a predetermined voltage. The interface between the region 26 and the epitaxial layer 21 forms a PN junction which is in parallel with the Schottky diode. This junction does not conduct when forward biased since conduction occurs at a lower potential through the Schottky diode. However, as will be explained in more detail, when reversed biased, this PN junction conducts at approximately the same potential, or at a lower potential, than the Schottky diode. The guard band region 26 in addition to providing this circuit protection substantially reduces current leakage at the edge of the Schottky diode.

Figure 4:
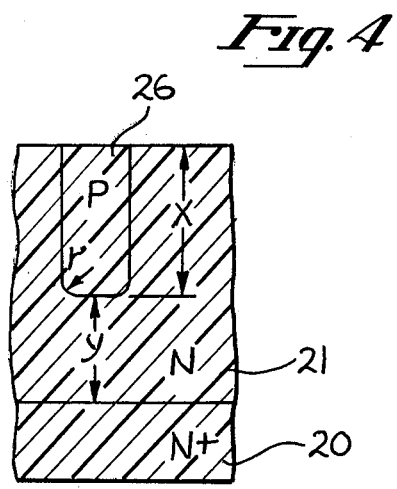
FIG. 4 is a partial cross-sectional view of the device of FIGS. 2 and 3 taken through section line 4—4 of FIG. 2.

As mentioned, the breakdown potential of the PN junction is approximately equal to, or lower than, the breakdown potential of the Schottky diode. This relationship in breakdown potentials may be achieved by employing well-known semiconductor technology and in particular by controlling the geometry of the guard band, and dopant concentration levels. Referring to FIG. 4, a lower breakdown potential for the PN junction may be obtained from high electric fields associated with the radius "r" of region 26. This radius may be controlled by the depth "X" of the region 26 and by the p-type impurity concentration gradient. The breakdown voltage of the PN junction may also be controlled by limiting the maximum depth of the depletion region in the epitaxial layer 21 (dimension "Y").

By way of example, assume that the substrate 20 is doped with antimony to a concentration level of at least $1 \times 10^{18}/cm^3$, and that the epitaxial layer 21 is doped with phosphorus to a concentration level of approximately $1 \times 10^{16}/cm^3$. A boron doped guard ring may be employed with the dimension X approximately equal to, or less than, 3.5 microns and the dimension Y may be equal to, or less than, approximately 3.0 microns. For this example the p-type region 26 is doped to a surface concentration level of approximately $1 \times 10^{19}/cm^3$, however, the surface concentration of this p-type dopant may range from $2 \times 10^{18}$ to $3 \times 10^{20}/cm^3$. If the epitaxial layer 21 is more lightly doped, for example, to a concentration level of $1 \times 10^{15}/cm^3$ the dimension X may be equal to, or less than, approximately 30 microns and the dimension Y may be equal to, or less than, approximately 20 microns.

In the presently preferred embodiment the metal layer 24 comprises tungsten, however, other metals may be employed such as chromium, molybdenum, platinum, or others.

Figure 5:
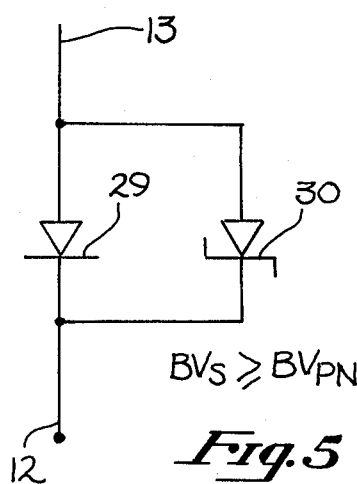
FIG. 5 is an equivalent circuit of the invented device.

The equivalent circuit for the device of FIGS. 2 and 3 is shown in FIG. 5 and includes diode 29 coupled between an anode lead or terminal 13 and an cathode lead or terminal 12. The metal-semiconductor barrier, that is, the Schottky diode is represented by this diode 29. The PN junction of FIGS. 2 and 3 is represented by the zener diode 30. The zener diode as indicated in FIG. 5 has a breakdown potential approximately equal to, or less than, the avalanche breakdown potential of the Schottky diode. Thus, when the diodes of FIG. 5 are reversed biased, the zener diode 30 conducts first, clamping the diode 29 to a predetermined potential. This protects the Schottky diode from large reverse currents. When the diodes of FIG. 5 are forward biased, diode 29 conducts at a lower potential, thus current does not flow through the diode 30.

Figure 1:
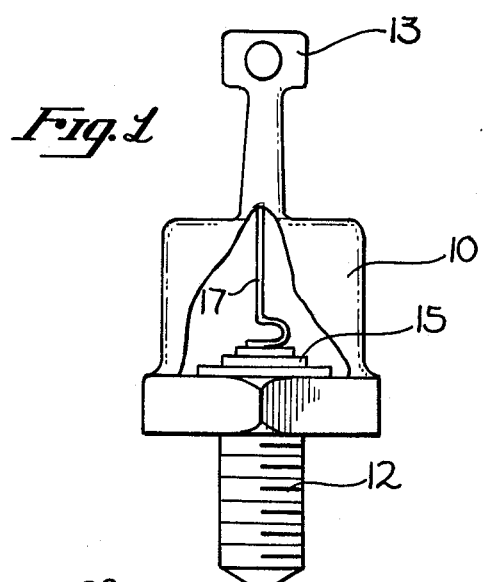
FIG. 1 is a cutaway view of a semiconductor case which includes a Schottky diode.

In FIG. 1 the "chip" 15 of FIGS. 2 and 3 is shown within a diode case 10. The metal layer 24 of FIGS. 2 and 3 is coupled through lead 17 to the anode terminal 13. The silicon substrate 20 of FIG. 2 is in electrical contact with the cathode terminal 12. As will be appreciated, any one of a plurality of known packages may be employed for the device of FIGS. 2 and 3.

Thus, a Schottky diode has been described which includes integral circuit protection means for protecting the Schottky diode from reverse potentials. A guard band fabricated within the semiconductor material provides a PN junction which conducts in a reverse direction before damage can occur to the Schottky diode. The guard band may be fabricated employing known semiconductor technology.

I claim:

1. A metal-semiconductor diode comprising:
   a semiconductor body of a first conductivity type including a silicon substrate having an epitaxial layer disposed thereon;
   a metal layer in contact with said epitaxial layer, said metal layer and epitaxial layer forming a metal-semiconductor barrier; and
   integral circuit protection means for protecting said metal-semiconductor barrier from large reverse potentials by voltage clamping said barrier to a predetermined potential, said circuit protection means comprising a region of a second conductivity type disposed in said epitaxial layer in contact with said metal layer, said region and epitaxial layer forming a junction, the breakdown voltage of said junction being approximately equal to or lower than the breakdown voltage of said barrier.

2. The diode according to claim 1, wherein said region is p-type, said substrate is n-type and said epitaxial layer is n-type and doped to a lesser concentration than said substrate.

3. The diode according to claim 2, wherein said region is diffused with boron, said metal layer is tungsten and said epitaxial layer is doped with phosphorus.

* * * * *